US007856607B2

(12) United States Patent
Grise et al.

(10) Patent No.: US 7,856,607 B2
(45) Date of Patent: Dec. 21, 2010

(54) SYSTEM AND METHOD FOR GENERATING AT-SPEED STRUCTURAL TESTS TO IMPROVE PROCESS AND ENVIRONMENTAL PARAMETER SPACE COVERAGE

(75) Inventors: Gary D. Grise, Colchester, VT (US); Peter A. Habitz, Hinesburg, VT (US); Vikram Iyengar, S. Burlington, VT (US); David E. Lackey, Jericho, VT (US); Chandramouli Visweswariah, Croton-on-Hudson, NY (US); Vladimir Zolotov, Putnam Valley, NY (US)

(73) Assignee: International Business Machines Corporation, New Orchard Rd., Armonk, NY (US)

( * ) Notice: Subject to any disclaimer, the term of this patent is extended or adjusted under 35 U.S.C. 154(b) by 480 days.

(21) Appl. No.: 11/934,146

(22) Filed: Nov. 2, 2007

(65) Prior Publication Data
US 2009/0119629 A1 May 7, 2009

(51) Int. Cl.
*G06F 17/50* (2006.01)
(52) U.S. Cl. .................................... 716/4; 716/5; 716/6
(58) Field of Classification Search ............... 716/4–6; 714/6, 724, 726, 729, 731, 732, 735, 736, 714/741, 745; 324/763
See application file for complete search history.

(56) References Cited

U.S. PATENT DOCUMENTS

| 4,905,183 | A | 2/1990 | Kawaguchi et al. |
| 5,396,170 | A | 3/1995 | D'Souza et al. |
| 6,032,281 | A | 2/2000 | Fujisaki |
| 6,345,373 | B1 | 2/2002 | Chakradhar et al. |
| 6,574,760 | B1 | 6/2003 | Mydill |
| 6,918,074 | B2 | 7/2005 | Kim et al. |
| 6,961,885 | B2 | 11/2005 | Man et al. |
| 6,975,954 | B2 | 12/2005 | Mak et al. |

(Continued)

FOREIGN PATENT DOCUMENTS

JP 04328476 11/1992

(Continued)

OTHER PUBLICATIONS

Nabil M. Abdulrazzaq, Sandeep K. Gupta, Path-Delay Fault Simulation for Circuits with Large Numbers of Paths for Very Large Test Sets, Proceedings of the 21st IEEE VLSI Test Symposium (VTS'03).

(Continued)

*Primary Examiner*—Vuthe Siek
(74) *Attorney, Agent, or Firm*—Downs Rachlin Martin PLLC (57) ABSTRACT

A system for enhancing the practicability of at-speed structural testing (ASST). In one embodiment, the system includes first means for performing statistical timing analysis on a design of logic circuitry. A second means performs a criticality analysis on the logic circuitry as a function of the statistical timing analysis so as to determine a criticality probability for each node of the logic circuitry. A third means selects nodes of the logic circuitry as a function of the criticality analysis. A fourth means selects timing paths as a function of the criticality probabilities of the selected nodes. A fifth means generates an ASST pattern for each of the selected timing paths. A sixth mean is provided to perform ASST on a fabricated instantiation of the design at functional speed using the generated ASST pattern.

25 Claims, 5 Drawing Sheets

U.S. PATENT DOCUMENTS

| | | | |
|---|---|---|---|
| 7,086,023 | B2 | 8/2006 | Visweswariah |
| 7,111,260 | B2 | 9/2006 | Visweswariah |
| 7,539,893 | B1 * | 5/2009 | Ferguson .................... 714/6 |
| 2004/0002844 | A1 | 1/2004 | Jess et al. |
| 2006/0112158 | A1 | 5/2006 | Tetelbaum |
| 2009/0094565 | A1 * | 4/2009 | Lackey et al. ................ 716/2 |

OTHER PUBLICATIONS

Mentor Graphics Announces Improved Performance and Advanced At-Speed Capabilities in FastScan for Testing Nanometer Designs; http://www.mentor.com/products/dft/news/improved-performance_fastscan.cfm; Sep. 22, 2003; pp. 1-2.

Scott Cook, Rethinking test at 130 nanometers and below; http://www.eetimes.com/news/design/showArticle.jhtml?articleID=17408660; Sep. 12, 2003; pp. 1-8; EE Times: Design News.

Sanjay Sengupta, Test Strategies for Nanometer Technologies; ITC International Test Conference; Panel p4.4; p. 1421.

Angela Krstic, Li-C. Wang, Kwang-Ting Cheng; Jing-Jia Liou; Diagnosis of Delay Defects Using Statistical Timing Models; Proceedings of the 21st IEEE VLSI Test Symposium ( VTS'03).

Qiang Peng, Fishwani D. Agrawal, Jacob Savir; On the Guaranteed Failing and Working Frequencies in Path Delay Fault Analysis; Proc. 16th IEEE Instrumentation and measurement Technology Conf., Venice, May 24-26, 1999; pp. 1794-1799.

Kai Yang, Li-C. Wang, Kwang-Ting Cheng, Sandip Kundu; On Statistical Correlation Based Path Selection for Timing Validation; VLSI Design, Automation and Test, 2005 (VLSI-TSA-DAT) 2005 IEEE VLSI-TSA International Symposium; Apr. 27-29, 2005; pp. 8-11.

Li-C. Wang, Jing-Jia Liou, Kwang-Ting Cheng; Critical Path Selection for Delay Fault Testing Based Upon a Statistical Timing Model; IEEE Transactions on Computer-Aided Design of Integrated Circuits and Systems, vol. 23, No. 11, Nov. 2004; pp. 1550-1565.

Jing-Jia Liou, Li-C. Wang, Kwang-Ting Cheng; On Theoretical and Practical Considerations of Path Selection for Delay Fault Testing; Computer Aided Design, ICCAD 2002; IEEE/ACM International Conference; Nov. 10-14, 2002; pp. 94-100.

* cited by examiner

SYSTEM AND METHOD FOR GENERATING AT-SPEED STRUCTURAL TESTS TO IMPROVE PROCESS AND ENVIRONMENTAL PARAMETER SPACE COVERAGE

FIELD OF THE DISCLOSURE

The present disclosure generally relates to the field of testing integrated circuit designs. In particular, the present disclosure is directed to a system and method for generating at-speed structural tests to improve process and environmental parameter space coverage.

BACKGROUND

Modern integrated circuits (ICs) exhibit large amounts of variability in their performance because of variations in manufacturing processes and environmental parameters. The range of these variations defines a process space, and at differing points in the process space differing timing paths may be critical. One approach for testing timing path criticality is to test all timing paths for all possible combination of timing-influencing parameters. However, as integration scale continues to grow, the number of timing paths in a particular IC design increases, and this approach becomes impractical to implement. Therefore, a challenge exists for testing ICs in a manner that provides broad test coverage of the process space in a reasonable amount of time.

Current IC testing approaches may include, for example, at-speed functional testing on a tester and/or functional test in a system. However, these approaches typically require expensive test systems and intensive manual effort. Furthermore, the test coverage cannot be accurately measured. Another approach to testing ICs is transition-fault testing based on tester clocks. However, such tests do not exercise the functional clock tree on the chip, do not test paths in a functional manner, and do not detect small delay defects on paths that are affected by process variations. Yet another approach to testing ICs is path-delay testing based on static timing analysis (STA). However, STA produces many false or Boolean unsensitizable paths. Furthermore, STA is not accurate in uncovering paths that are affected by process variations. Consequently, process coverage is poor using path delay testing based on STA. Yet another approach to testing ICs is to perform at-speed structural testing (ASST) to test transition faults without respect to critical paths. However, ASST may not exercise critical paths and, hence, performance validation is not achieved.

SUMMARY OF THE DISCLOSURE

In one embodiment, the present disclosure is directed to a method of testing logic circuitry. The method includes: performing a statistical timing analysis on a design of logic circuitry; performing a criticality analysis on the logic circuitry as a function of the statistical timing analysis so as to determine a criticality probability for each node; selecting a plurality of nodes of the logic circuitry as a function of the criticality analysis; selecting a plurality of timing paths as a function of the criticality probabilities of the plurality of nodes; and generating an at-speed structural test (ASST) pattern for each of the plurality of timing paths.

In another embodiment, the present disclosure is directed to a method of achieving a desired shipped product quality level of a plurality of fabricated integrated circuit chips. The method includes: performing a statistical timing analysis on logic circuitry of a chip design; performing a criticality analysis on the logic circuitry as a function of the statistical timing analysis so as to determine a criticality probability for each node; selecting a plurality of nodes of the logic circuitry as a function of the criticality analysis; selecting a plurality of timing paths as a function of the criticality probabilities of the plurality of nodes; generating an at-speed structural test (ASST) pattern for each of the plurality of timing paths; providing a plurality of instantiations of the chip design; and performing an ASST on each of the plurality of instantiations using the ASST patterns.

In a further embodiment the present disclosure is directed to a method of bench testing an instantiation of an integrated circuit design. The method includes: performing a statistical timing analysis on logic circuitry of an integrated circuitry design; performing a criticality analysis on the logic circuitry as a function of the statistical timing analysis so as to determine a criticality probability for each node; selecting a plurality of nodes of the logic circuitry as a function of the criticality analysis; selecting a plurality of timing paths as a function of the criticality probabilities of the plurality of nodes; generating an at-speed structural test (ASST) pattern for each of the plurality of timing paths; providing an instantiation of the integrated circuit design; and performing an ASST on the instantiation using the ASST patterns until at least one timing path failure occurs.

In yet another embodiment, the present disclosure is directed to a system for testing an instantiation of an integrated circuit design. The system includes: first means for performing a statistical timing analysis on a design of logic circuitry; second means in communication with the first means for performing a criticality analysis on the logic circuitry as a function of the statistical timing analysis so as to determine a criticality probability for each node; third means in communication with the second means for selecting a plurality of nodes of the logic circuitry as a function of the criticality analysis; fourth means in communication with the third means for selecting a plurality of timing paths as a function of the criticality probabilities of the plurality of nodes; and fifth means in communication with the fourth means for generating an at-speed structural test (ASST) pattern for each of the plurality of timing paths.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1:
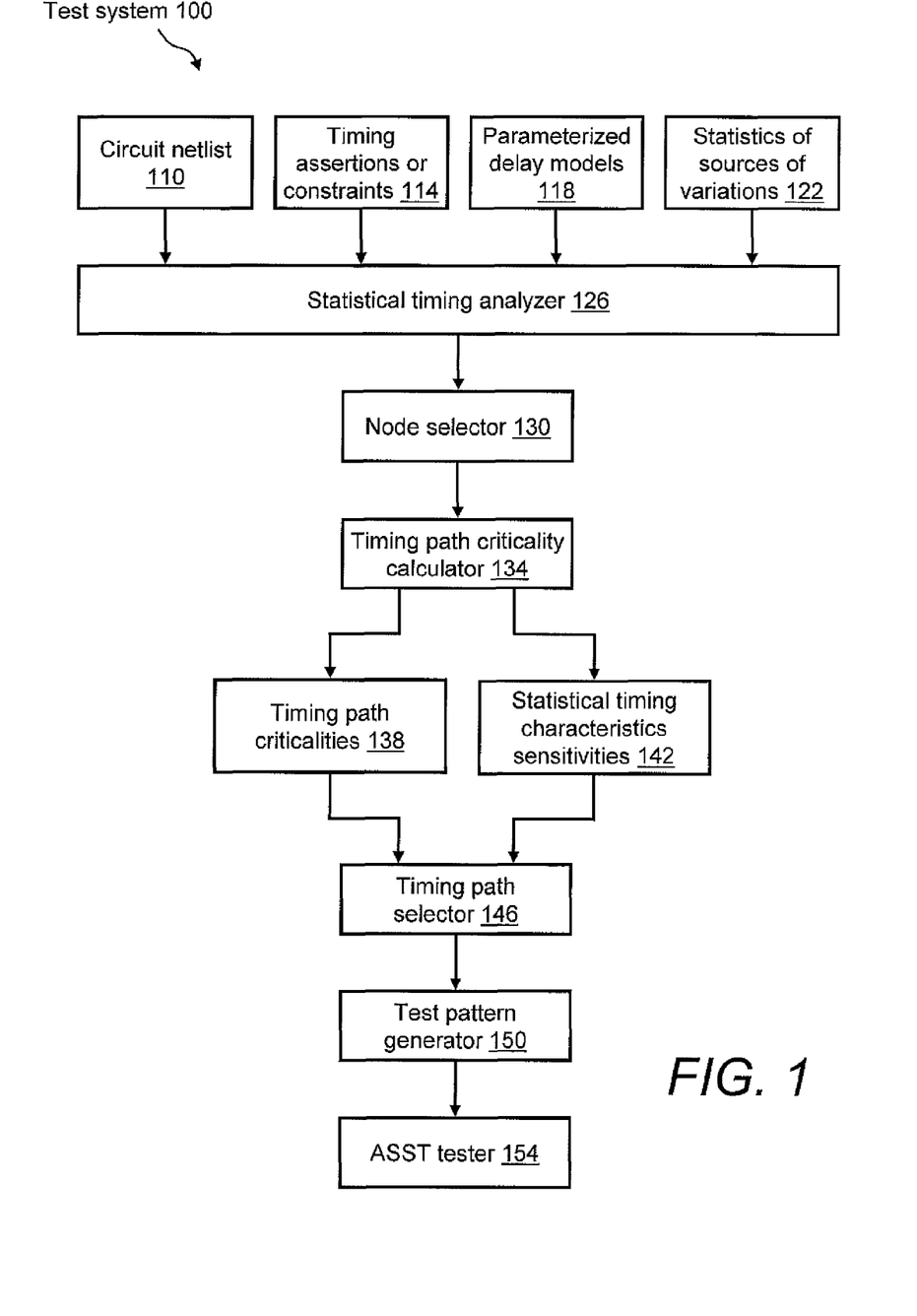
FIG. 1 is a block diagram of a test system for performing at-speed structural testing (ASST) for maximizing test coverage of a process space.

Referring to the drawings, FIG. 1 illustrates an example 100 of a test system for performing at-speed structural testing (ASST) on one or more fabricated integrated circuits (ICs) (not shown). As discussed below in greater detail, exemplary test system 100 uses timing path criticality probability as a basis for selecting which timing path(s) to test during ASST of the IC(s). Selecting the timing path(s) in this manner allows for the realization of the benefits of ASST, e.g., full functional-speed testing using actual clock trees, while also minimizing the time needed to provide ample test coverage of the process space.

Test system 100 may be configured to receive a plurality of inputs, such as first, second, third, and fourth inputs 110, 114, 118, 122. First input 110 is a circuit netlist that represents the structure of a circuit to be analyzed. Second input 114 is a set of timing assertions or constraints. In one example, timing assertions or constraints 114 may include arrival times at the primary inputs, required arrival times at primary outputs, information about phases of a clock, and details of external loads driven by the primary outputs. The timing assertions or constraints may be in the form of, for example, deterministic numbers, independent probability distributions, correlated probability distributions, and any combinations thereof. Third input 118 is a set of parameterized delay models that allow a timer to determine the delay of a gate or wire as a function of delay-model variables (e.g., input slew or rise/fail time, and output load) as well as a function of sources of variation. For example, a first-order linear model, as described in U.S. Pat. No. 7,086,023, which is titled "System and Method for Probabilistic Criticality Prediction of Digital Circuits" and is incorporated herein by reference in relevant part, may be used to determine the delay. Fourth input 122 is information about the statistics of sources of variation. In one example, the sources of variation include a list of the sources of variations with a mean value and standard deviation for each source of variation.

Test system 100 includes a statistical timing analyzer 126, which is configured to receive inputs 110, 114, 118, 122. In one example, statistical timing analyzer 126 may be as described in U.S. Pat. No. 7,111,260, which is titled "System and Method for Incremental Statistical Timing Analysis of Digital Circuits" and is incorporated herein by reference in relevant part. The '260 patent describes a system and method for efficiently and incrementally updating the statistical timing of a digital circuit after a change has been made in the circuit. One or more changes in the circuit is/are followed by timing queries that are answered efficiently, constituting a mode of timing that is most useful in the inner loop of an automatic computer-aided design (CAD) synthesis or optimization tool. In the statistical re-timing of the '260 patent, the delay of each gate or wire is assumed to consist of a nominal portion, a correlated random portion that is parameterized by each of the sources of variation, and an independent random portion. Correlations are taken into account. Both early mode and late mode timing are included, both combinational and sequential circuits are handled, and static CMOS as well as dynamic logic families are accommodated.

Based on the statistical timing analysis of statistical timing analyzer 126, a node selector 130 identifies a plurality of critical nodes within the IC design of interest. In one example, a certain number of the most critical nodes are selected. Based on these selected critical nodes, a timing path criticality calculator 134 calculates the probability of criticality for each timing path that contains the selected nodes. For example, a criticality of a certain timing path provides the probability of manufacturing a chip in which the certain timing path is a timing-critical signal propagation path.

In one example, timing path criticality calculator 134 performs a criticality calculation according to U.S. Pat. No. 7,086,023, which is titled "System and Method for Probabilistic Criticality Prediction of Digital Circuits" and is incorporated by reference herein in relevant part. The '023 patent describes a system and method for determining criticality probability of each node, edge and path of the timing graph of a digital circuit in the presence of delay variations. The delay of each gate or wire is assumed to consist of a nominal portion, a correlated random portion that is parameterized by each of the sources of variation and an independent random portion. Correlations are taken into account. Both early mode and late mode timing are included, both combinational and sequential circuits are handled, and static CMOS as well as dynamic logic families are accommodated. The criticality determination complexity is linear in the size of the graph and the number of sources of variation. The '023 patent includes a method for efficiently enumerating the critical path(s) that is/are most likely to be critical.

Timing path criticality calculator 134 generates a list of timing path criticalities 138. In one example, timing path criticalities 138 includes a list of one or more critical paths passing through each critical node, as determined by well-known path tracing procedures, and their respective percent criticality values, which may be listed in order from highest criticality to lowest criticality. The concept of critical paths and nodes is illustrated with reference to FIG. 2.

Figure 2:
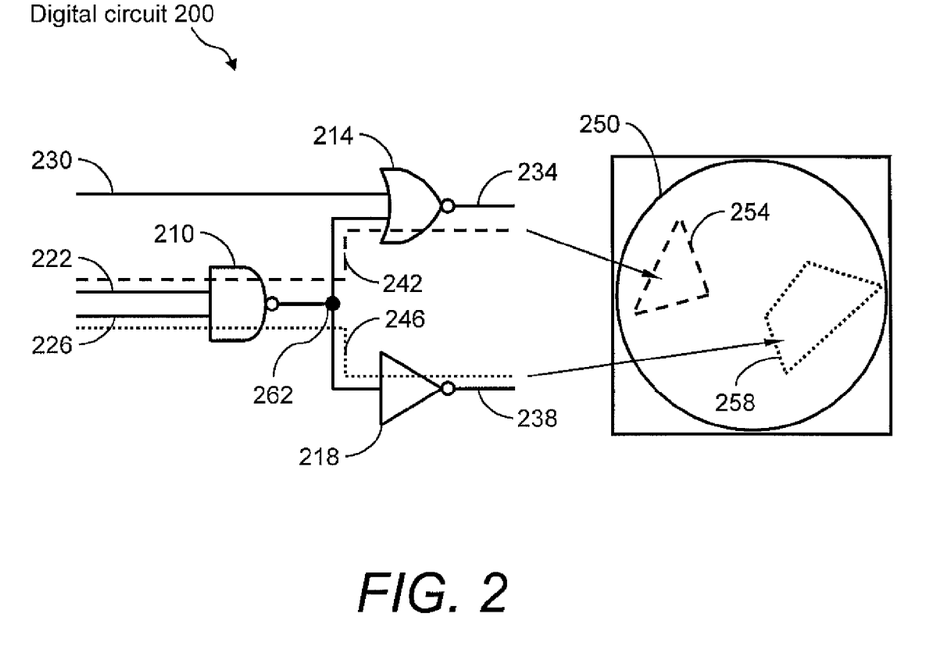
FIG. 2 is a schematic diagram of a sample digital circuit and a graphical representation of a process space illustrating regions of the process space in which each of two identified timing paths are critical.

FIG. 2 illustrates a schematic diagram of a highly simplified sample digital circuit 200 within which one or more critical nodes and/or critical paths may be identified. For example, digital circuit 200 may include gates 210, 214, 218. Digital circuit 200 has primary inputs 222, 226, 230, and primary outputs 234, 238. Included in a first exemplary critical path 242 are primary input 222, gate 210, gate 214, and primary output 234. Included in a second exemplary critical path 246 are primary input 226, gate 210, gate 218, and primary output 238. Also shown in FIG. 2 is a process space 250, within which the manufacturing process of digital circuit 200 falls. In the example, first exemplary critical path 242 falls within a process corner 254 of process space 250, and second exemplary critical path 246 falls within a process corner 258 of process space 250. In this example, a node 262 may be considered a critical node that has a high criticality probability value because it lies along the path of both first and second critical paths 242, 246.

Referring again to FIG. 1, timing path criticality calculator 134 further generates a list of statistical timing characteristics sensitivities 142. In one example, Statistical timing computes the sensitivity of timing characteristics 142 of the chip (such as timing slack) to sources of variation. These sensitivities help us to estimate how chip timing will change due to process variations. They also help us to estimate circuit performance as a probability distribution. Finally, the sensitivities help us to estimate the robustness of chip designs.

Based on timing path criticalities 138 and statistical timing characteristics sensitivities 142, a set of timing paths to be tested are selected using a timing path selector 146. A test pattern generator 150 is used to generate test patterns that robustly exercise each of the paths to be tested, which are provided by timing path selector 146. In one example, a unique test pattern is generated for each path to be tested, such as a unique test pattern for critical path 242 and a unique test pattern for critical path 246 of digital circuit 200 of FIG. 2. In another example, for improved test efficiency, the test patterns of test pattern generator 150 may be consolidated such that one test pattern may exercise multiple paths to be tested, such as one test pattern for both critical path 242 and critical path 246 of digital circuit 200 of FIG. 2.

The test patterns generated by test pattern generator 150 are then applied to a device under test (not shown) using an ASST tester 154, which may be any suitable ASST tester for testing ICs, such as a conventional automated ASST tester. In one example, ASST tester 154 may be a product characterization tester for performing diagnostics and analyzing product defects in a laboratory environment. In another example, ASST tester 154 may be a manufacturing tester in a manufacturing environment for supplying IC devices of a certain performance specification to customers.

A summary of the operation of a test system 100 for maximizing the test coverage of an IC using criticality probability is as follows. A design (not shown) of logic circuitry is provided upon which a statistical timing analysis performed by statistical timing analyzer 126. Subsequently, a plurality of nodes of the logic circuitry design is selected by node selector 130 as a function of the statistical timing analysis of statistical timing analyzer 126. Subsequently, a criticality analysis is performed by timing path criticality calculator 134, which generates timing path criticalities 138 as a function of the selected nodes in order to determine a criticality probability for each of the selected nodes and each of multiple timing paths that contain the selected nodes. Subsequently, at least one timing path of the timing paths is selected by timing path selector 146 as a function of the criticality probability. Subsequently, an ASST pattern is generated for each of the timing paths by test pattern generator 150. Then, the manufactured logic circuitry of interest is tested using ASST tester 154. More details of an example method of using a test system of the present disclosure, such as test system 100, that makes use of criticality probability to improve test coverage is described with reference to FIG. 3.

Figure 3:
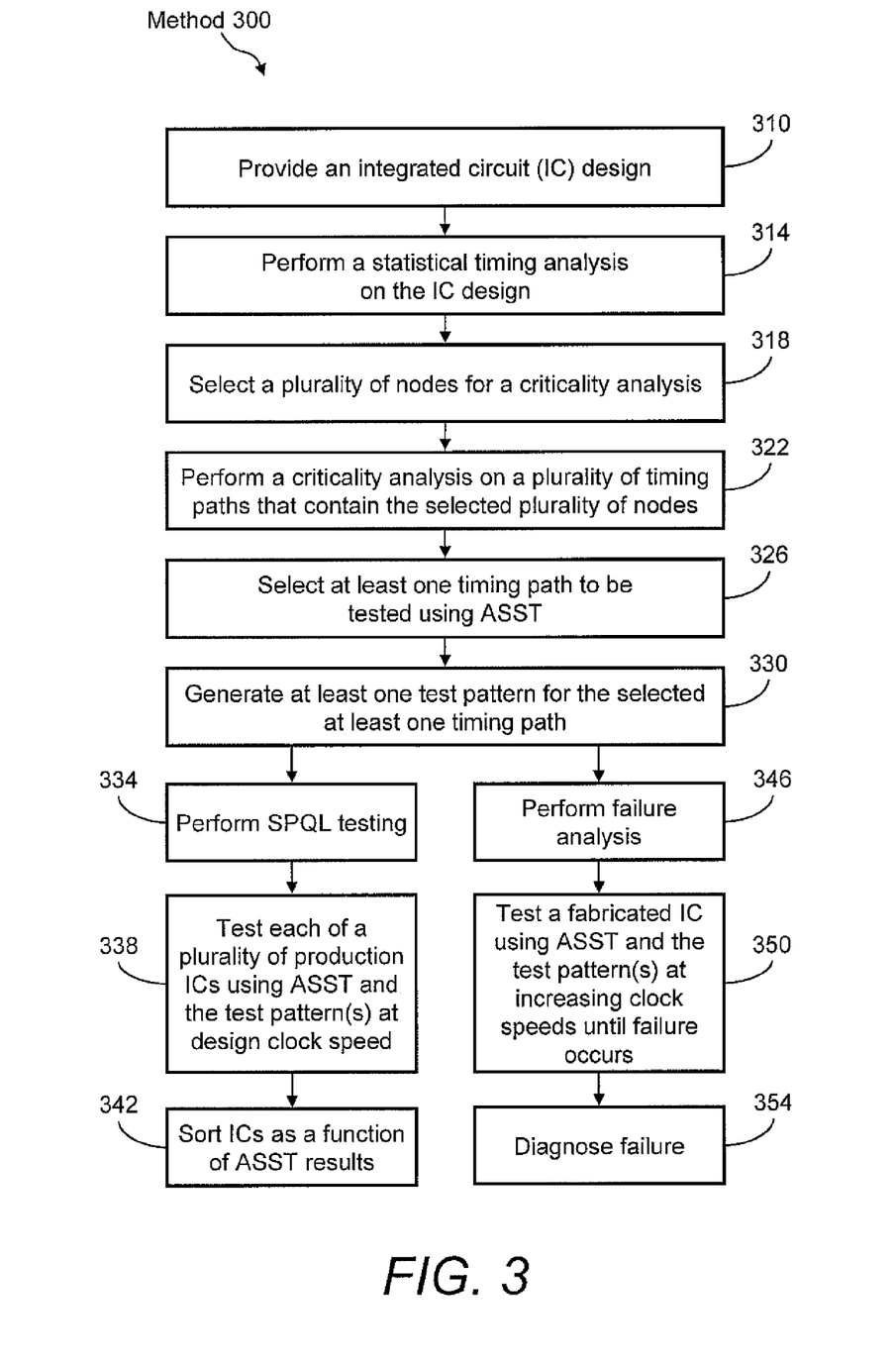
FIG. 3 is a flow diagram of a method of performing ASST that maximizes the coverage of the process space.
Figure 4A:
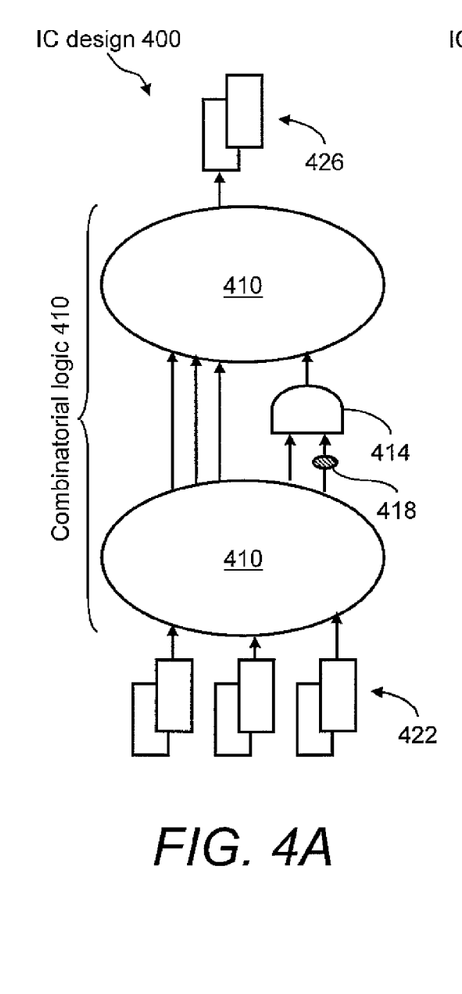
FIG. 4A is a schematic diagram illustrating an identified node of interest within combinational logic of an integrated circuit (IC) design.
Figure 4B:
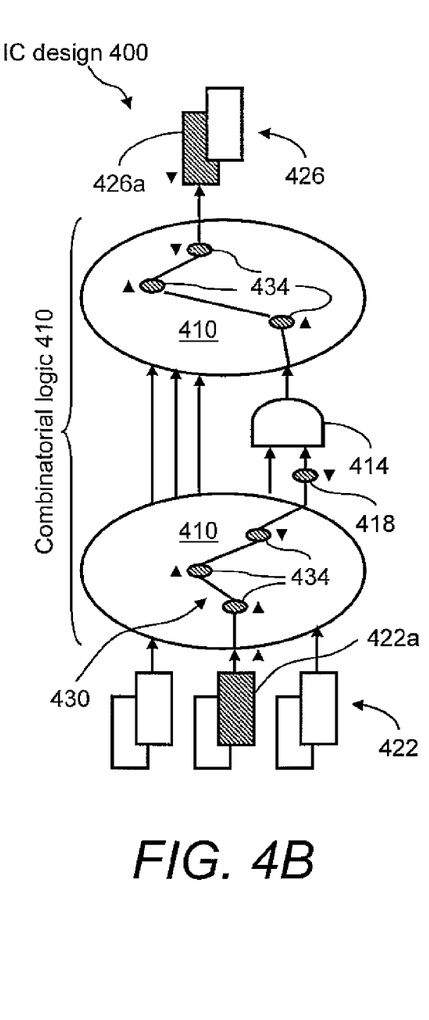
FIG. 4B is a schematic diagram illustrating an identified timing path of interest containing the identified node of FIG. 4A.
Figure 4C:
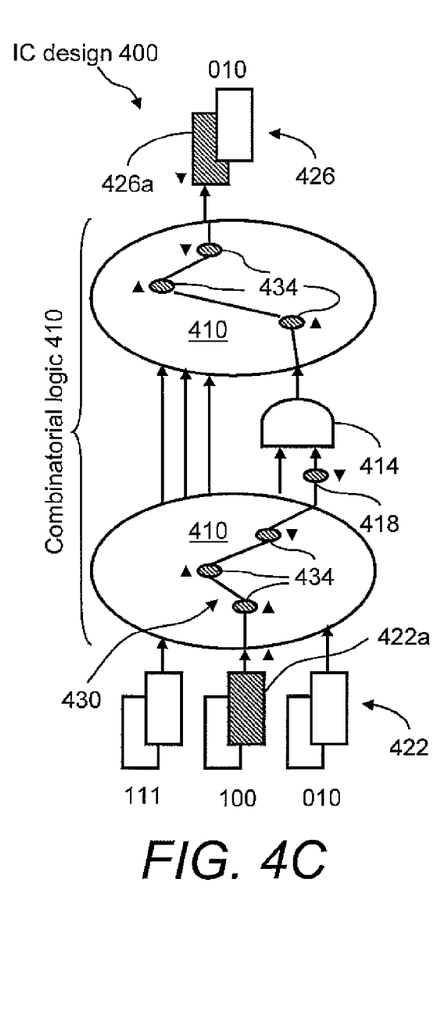
FIG. 4C is a schematic diagram illustrating the identified timing path of FIG. 4B being tested with an ASST pattern.

FIG. 3 illustrates a flow diagram of an example 300 of a method of maximizing the coverage of the process and environmental parameter space during ASST. For convenience, exemplary method 300 is described in the context of testing system 100 of FIG. 1 and a simple logic circuit design 400 as illustrated in FIGS. 4A-C. Of course, method 300 may be performed using another testing system made in accordance with the principles of the present disclosure and in the context of other logic circuit designs. Method 300 may include, but is not necessarily limited to, the following steps.

Referring now to FIG. 3, and also to FIGS. 1 and 4A-C, at step 310, a design 400 (FIGS. 4A-C) of a logic circuitry is provided for which test patterns are to be generated by, in this example, test system 100 of FIG. 1. In one example, design 400 is provided via an automatic CAD synthesis tool. Illustrative logic circuitry design 400 of FIGS. 4A, 4B, and 4C includes an arrangement of combinatorial logic 410 to be tested. Further to this simple example, combinatorial logic 410 includes a gate 414 and a node 418. A set of input latches 422 provides the logic stimulus entry mechanism for combinatorial logic 410, and a set of output latches 426 provides the logic exit mechanism for combinatorial logic 410.

Referring again to FIG. 3, at step 314 a statistical timing analysis is performed on the IC design 400 of FIGS. 4A, 4B, and 4C by statistical timing analyzer 126 of test system 100 (FIG. 1). As described above, the statistical timing analysis that is performed by statistical timing analyzer 126 may be as described in the '260 patent, mentioned above, that describes a system and method for efficiently and incrementally updating the statistical timing of a digital circuit after a change has been made in the circuit.

At step 318 and based on the statistical timing analysis of step 314, a certain number of nodes of logic circuit design 400 are selected by node selector 130. In the present example, node 418 of logic circuitry design 400 is selected as a critical node. At step 322, a criticality analysis on a plurality of timing paths that contain the selected nodes of step 318 is performed by timing path criticality calculator 134. As described above, timing path criticality calculator 134 may perform criticality calculations according to the '023 patent, mentioned above, that describes a system and method for determining criticality probability of each node, edge and path of the timing graph of a digital circuit in the presence of delay variations. A criticality analysis is performed by timing path criticality calculator 134 on the timing path(s), here, timing path 430, of logic circuitry design 400 of FIGS. 4A, 4B, and 4C that contains node 418.

At step 326, at least one timing path to be tested with one or more ASST patterns is selected by timing path selector 146. In one example, at least one timing path that has a certain criticality probability value is selected. In another example, a certain number of timing paths that have a criticality probability value equal to or higher than a predetermined value are selected. In the present example, timing path 430 of logic circuitry design 400 that contains critical node 418 is selected. Timing path 430 of logic circuitry design 400 is formed by a plurality of nodes 434 in combination with node 418 and gate 414 that form a critical timing path between input latch 422a and output latch 426a, as shown in FIG. 4B.

At step 330, one or more test patterns for the timing paths selected in step 326, here, timing path 430, are generated by test pattern generator 150. In one example, a unique test pattern is generated for the timing paths to be tested. In another example, the test patterns generated by test pattern generator 150 may be consolidated such that one test pattern may exercise multiple timing paths to be tested. Method 300 may proceed to step 334 for a product characterization operation or method 300 may proceed to step 346 for a product manufacturing test operation.

At step 334, shipped product quality level (SPQL) testing is performed by ASST tester 154 in a manufacturing environment for supplying a plurality of fabricated IC devices of a certain performance specification to customers. At step 338 in the SPQL testing operations, each of a plurality of production IC devices are tested at design functional clock speed by use of ASST and the test pattern(s) generated in step 330. In the current example, timing path 430 of logic circuitry design 400 that contains critical node 418 is exercised using the SPQL testing operations. Boolean patterns are applied in such a way to allow rising and falling transitions to pass through the entirety of timing path 430. In this example, a certain binary value is provided at input latches 422, as shown in FIG. 4C. A clock is applied, and a corresponding binary result is presented at output latches 426, as shown in FIG. 4C. At step 342, the IC devices under test, in this example the devices incorporating logic circuitry design 400, are sorted as a function of the ASST results of step 338, e.g., by comparing the binary test result presented at output latches 426 (FIG. 4C) to an expected binary result.

Alternatively to SPQL testing of steps 334, 338, 342, at step 346 failure analysis of the IC device(s) of interest is performed. In one example, ASST tester 154 may be used to perform diagnostics and analyze product defects in a laboratory environment. In another example, ASST tester 154 may be used to perform diagnostics and analyze product defects in a laboratory environment on timing path 430 of logic circuitry design 400. At step 350, for the purpose of product characterization, a fabricated IC may be tested at increasing clock speeds until failure occurs using ASST and the test pattern(s) generated in step 330. In one example, circuitry of the device under test, here, logic circuitry design 400, is tested at increasing clock speeds using ASST and the test pattern(s) that are generated in step 330 until failure occurs on timing path 430.

At step 354, IC failure analysis techniques, for example, techniques known in the art, may be used to analyze any failures detected in step 350 to determine the cause of the failure, such as a manufacturing flaw. For example, it may be determined which timing path failed and, thus, it may be determined which process parameter is causing the failure. Additionally, determining the frequency at which the failure occurs allows speed-sorting of the IC devices. In one example, if a failure is detected on timing path 430 of logic circuitry design 400, the failure is diagnosed in order to determine the manufacturing flaw of logic circuitry design 400.

Figure 5:
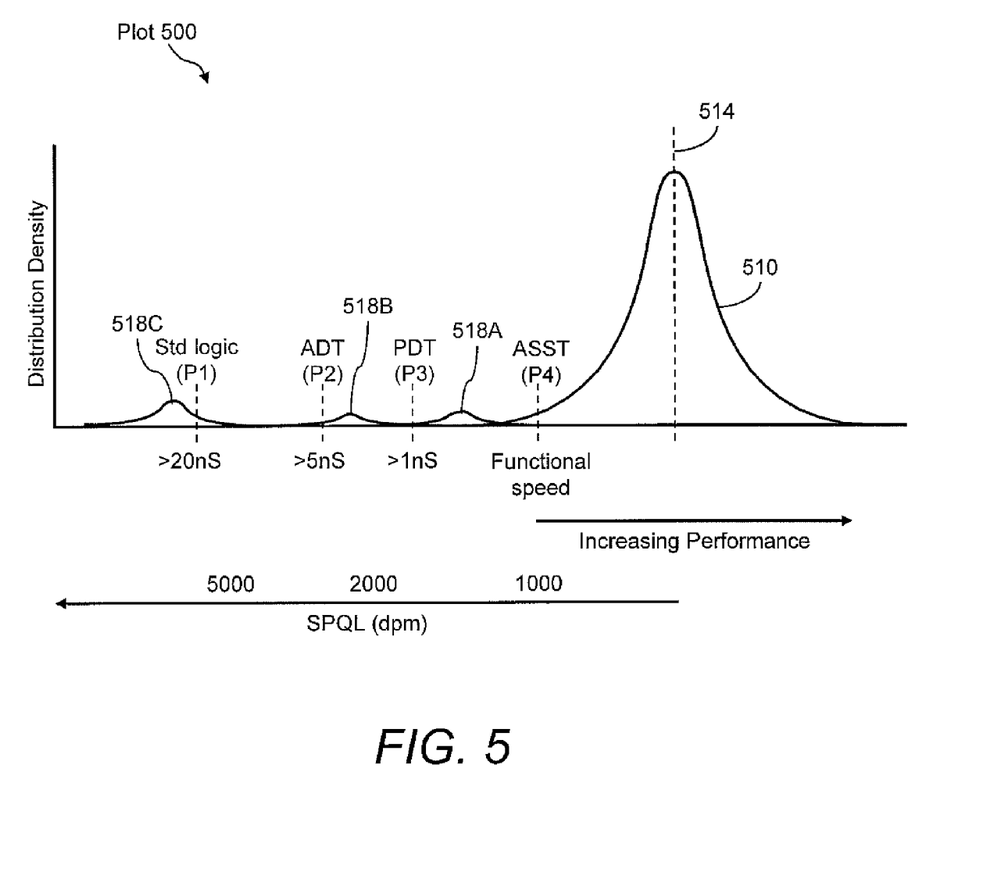
FIG. 5 is plot of an example statistical distribution curve of the performance of ICs made using particular fabrication processes.

FIG. 5 contains a plot 500 of an example performance distribution curve 510 for a particular production run of IC chips all made using the same process. Performance distribution curve 510 has a certain mean performance 514. Various test speeds S1, S2, S3, S4, with increasing performance from P1 to P4, are shown along performance distribution curve 510 and correspond, respectively, to the test speeds achievable using standard logic testing (SLT) (S1), automated delay testing (ADT) (S2), premium delay testing (PDT) (S3), and ASST (S4). As seen from plot 500, ASST, which is performed at full functional speed at performance point P4, clearly provides the best result among the group of SLT, ADT, PDT, and ASST. However, PDT, which is performed at test speed S3, does not detect chips that fall within defect population 518A, ADT, which is performed at test speed S2 does not detect chips that fall within either of defect populations 518A, 518B, and SLT, which is performed at test speed S1 not only does not detect chips falling within either of defect populations 518A, 518B, but also some of the chips in defect population 518C.

While ASST is a desirable testing method because of its superiority over other testing methods, it is time-consuming and, prior to the present invention, is generally not practicable for characterizing all production chips made using a particular process. However, using a test system and method of the present invention, such as test system 100 of FIG. 1 and method 300 of FIG. 3, the time needed in performing ASST can be greatly reduced, while not eviscerating the benefit of full conventional ASST. Plot 500 of FIG. 5 also illustrates that using a test system and method of the present invention, such as test system 100 and method 300, that utilizes criticality probability to determine and test a subset of performance-limiting timing paths, a mechanism is provided to narrow the distribution and, thus, device performance may be guaranteed at, for example, speed S4, which is an improvement as compared with slower speeds S1, S2, and S3 that are the result of less robust test methodologies.

Referring again to FIGS. 1 through 5, an important aspect of test system 100 and method 300 is the use of criticality probability, such as described in the '023 patent, based on statistical timing analysis, such as described in the '260 patent, to achieve improved test coverage of the process space by creating and executing a set of ASST test patterns that exercise a subset of timing paths that may be critical in any configuration of process parameters. In particular, using test system 100 and method 300, small (parametric) defects that arise from process variations and that contribute to slow performance on critical paths may be tested, IC performance may be validated cheaply using amortized-cost testers without intensive manual effort, the functional clocks if the IC are used in a functional manner exactly as they are used in mission mode, and an efficient mechanism is provided to sort out the outer limits of the process distributions, which enables speed-sorting and enables performance versus yield tradeoffs.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A method of testing logic circuitry, comprising:
performing a statistical timing analysis on a design of logic circuitry;
performing a criticality analysis on said logic circuitry as a function of said statistical timing analysis so as to determine a criticality probability for each node;
selecting a plurality of nodes of said logic circuitry as a function of said criticality analysis;
selecting a plurality of timing paths as a function of said criticality probabilities of said plurality of nodes; and
generating an at-speed structural test (ASST) pattern for each of said plurality of timing paths; and
inputting each said ASST pattern into an ASST tester.

2. The method of claim 1, wherein said selected plurality of nodes have the highest criticality probabilities among all nodes in said logic circuitry.

3. The method of claim 2, wherein said selected plurality of timing paths pass through said selected plurality of nodes.

4. The method of claim 3, wherein said selected plurality of timing paths have the least amount of timing slack among all the timing paths passing through said selected plurality of nodes.

5. The method of claim 1, further comprising providing a fabricated instantiation of said design and performing, with said ASST tester, an ASST on said fabricated instantiation using said ASST patterns.

6. The method of claim 5, wherein said design has a design functional clock speed and said performing of said ASST includes performing said ASST at said design functional clock speed.

7. The method of claim 1, further comprising providing a fabricated instantiation of said design and performing, using said ASST tester, a plurality of ASSTs on said fabricated instantiation using said ASST patterns, using a differing functional clock speed for each of said plurality of ASSTs.

8. The method of claim 7, wherein said performing of a plurality of ASSTs on said fabricated instantiation includes performing said plurality of ASSTs using increasing functional clock speeds until a timing path failure occurs.

9. A method of achieving a desired shipped product quality level of a plurality of fabricated integrated circuit chips, comprising:
performing a statistical timing analysis on logic circuitry of a chip design;
performing a criticality analysis on said logic circuitry as a function of said statistical timing analysis so as to determine a criticality probability for each node;
selecting a plurality of nodes of said logic circuitry as a function of said criticality analysis;
selecting a plurality of timing paths as a function of said criticality probabilities of said plurality of nodes;

generating an at-speed structural test (ASST) pattern for each of said plurality of timing paths;
providing a plurality of instantiations of said chip design; and
performing an ASST on each of said plurality of instantiations using said ASST patterns.

10. The method of claim 9, wherein said selected plurality of nodes have the highest criticality probabilities among all nodes in said logic circuitry.

11. The method of claim 10, wherein said selected plurality of timing paths pass through said selected plurality of nodes.

12. The method of claim 11, wherein said selected plurality of timing paths have the least amount of timing slack among all the timing paths passing through said selected plurality of nodes.

13. The method of claim 12, further comprising determining whether each of said plurality of instantiations passes or fails as a function of said ASST for said each of said plurality of instantiations.

14. A method of bench testing an instantiation of an integrated circuit design, comprising:
performing a statistical timing analysis on logic circuitry of an integrated circuitry design;
performing a criticality analysis on said logic circuitry as a function of said statistical timing analysis so as to determine a criticality probability for each node;
selecting a plurality of nodes of said logic circuitry as a function of said criticality analysis;
selecting a plurality of timing paths as a function of said criticality probabilities of said plurality of nodes;
generating an at-speed structural test (ASST) pattern for each of said plurality of timing paths;
providing an instantiation of said integrated circuit design; and
performing an ASST on said instantiation using said ASST patterns until at least one timing path failure occurs.

15. The method of claim 14, wherein said design has a design functional clock speed and said performing of said ASST includes performing said ASST at said design functional clock speed.

16. The method of claim 15, further comprising performing a plurality of ASSTs on said fabricated instantiation using said ASST patterns, using a differing functional clock speed for each of said plurality of ASSTs.

17. The method of claim 16, wherein said performing of a plurality of ASSTs on said fabricated instantiation includes performing said plurality of ASSTs using increasing functional clock speeds until at least one timing path failure occurs.

18. The method of claim 17, further comprising determining the timing path cause of failure from among all of said selected timing paths.

19. The method of claim 17, further comprising performing said plurality of ASSTs using increasing functional clock speeds until all said selected timing paths fail.

20. The method of claim 19, further comprising comparing each functional clock speed for which each said selected timing path failure is expected to occur as predicted by a statistical timing analysis, to each actual functional clock speed for which each said selected timing path failure occurs after performing said plurality of said ASSTs on said instantiation of said design.

21. The method of claim 20, further comprising adjusting the statistical timing, such that each functional clock speed for which each said selected timing path failure is expected to occur as predicted by a statistical timing analysis equals each actual functional clock speed for which each said selected timing path failure occurs after performing said plurality of said ASSTs on said instantiation of said design.

22. A system for testing an instantiation of an integrated circuit design, comprising:
performing statistical timing analyzer configured to perform a statistical timing analysis on a design of logic circuitry;
a timing path criticality calculator configured to perform a criticality analysis on said logic circuitry as a function of said statistical timing analysis so as to determine a criticality probability for each node;
a node selector configured to select a plurality of nodes of said logic circuitry as a function of said criticality analysis;
a timing path selector configured to select a plurality of timing paths as a function of said criticality probabilities of said plurality of nodes;
a test pattern generator configured to generate an at-speed structural test (ASST) pattern for each of said plurality of timing paths; and
an ASST tester configured to perform an ASST on a fabricated instantiation of said design using said ASST pattern.

23. The system of claim 22, wherein said node selector is configured to select a plurality of nodes that have the highest criticality probabilities among all nodes in said logic circuitry.

24. The system of claim 23, wherein said timing path selector is configured to select a plurality of timing paths that pass through said selected plurality of nodes.

25. The system of claim 24, wherein said ASST tester is configured to perform said ASST using increasing functional clock speeds until a timing path failure occurs.

* * * * *